United States Patent
Sirkis et al.

(10) Patent No.: US 6,753,498 B2
(45) Date of Patent: Jun. 22, 2004

(54) AUTOMATED ELECTRODE REPLACEMENT APPARATUS FOR A PLASMA PROCESSING SYSTEM

(75) Inventors: Murray D. Sirkis, Tempe, AZ (US); Eric Strang, Chandler, AZ (US); Yu Wang Bibby, St. Albans, VT (US); John E. Cronin, Milton, VT (US)

(73) Assignee: Tokyo Electron Limited, Tokyo (JP)

( * ) Notice: Subject to any disclaimer, the term of this patent is extended or adjusted under 35 U.S.C. 154(b) by 148 days.

(21) Appl. No.: 10/346,186

(22) Filed: Jan. 17, 2003

(65) Prior Publication Data

US 2003/0127433 A1 Jul. 10, 2003

Related U.S. Application Data

(63) Continuation of application No. PCT/US01/22508, filed on Jul. 19, 2001.
(60) Provisional application No. 60/219,737, filed on Jul. 20, 2000.

(51) Int. Cl.[7] .............................................. B23K 10/00
(52) U.S. Cl. ............................ 219/121.56; 219/121.43; 219/121.52; 156/345
(58) Field of Search ....................... 219/121.41, 121.43, 219/121.52, 119, 121.48, 121.56, 121.54; 156/345; 204/298.02; 118/723 I, 723 R; 313/231.31

(56) References Cited

U.S. PATENT DOCUMENTS

| 4,073,669 A | 2/1978 | Heinecke et al. |
| 5,074,456 A | 12/1991 | Degner et al. |
| 5,569,356 A | 10/1996 | Lenz et al. |
| 5,874,705 A | 2/1999 | Duan |
| 6,073,577 A | 6/2000 | Lilleland et al. |
| 6,245,189 B1 * | 6/2001 | Rigali et al. ................. 156/345 |

FOREIGN PATENT DOCUMENTS

| EP | 0 095 200 | 11/1983 |
| EP | 0 575 126 | 12/1993 |
| WO | WO 00/07264 | 2/2000 |
| WO | WO 00/19492 | 4/2000 |

OTHER PUBLICATIONS

Thornton et al., "Internal stresses in titanium, nickel, molybdenum and tantalum films deposited by cylindrical magnetron sputtering," J. Vac. Sci. Technol., vol. 14 (1), (1997), pp. 164–168.

Hoffman et al., "Effects of substrate orientation and rotation of internal stresses in sputtered metal film," J. Vac. Sci. Technol., vol. 16 (2) (1979), pp. 134–137.

Hoffman et al., "Modification of evaporated chromium by concurrent ion bombardment," J Vac.Sci. Technol., vol. 17 (1) (1990), pp. 425–428.

* cited by examiner

Primary Examiner—Mark Paschall
(74) Attorney, Agent, or Firm—Pillsbury Winthrop LLP

(57) ABSTRACT

A plasma processing system includes an automated electrode retention mechanism (130) for providing automated engagement of a source electrode (152) with a drive electrode (154). In addition, an automated electrode handling system (320) is provided that has the ability to remove a source electrode (152) from the electrode retention mechanism and replace it with a second source electrode (152') that is stored in a staging area (340) outside the plasma processing system vacuum chamber. The system may operate automatically under program control of a computer system (200) coupled thereto.

15 Claims, 3 Drawing Sheets

AUTOMATED ELECTRODE REPLACEMENT APPARATUS FOR A PLASMA PROCESSING SYSTEM

CROSS REFERENCE TO RELATED CO-PENDING APPLICATIONS

This a Continuation of International Application No. PCT/US01/22508, which was filed on Jul. 19, 2001 and claims priority from Provisional U.S. Application No. 60/219,737, which was filed Jul. 20, 2000. This application is also related to U.S. Provisional Application Nos. 60/219,735 and 60/219,453, both filed on Jul. 20, 2000, the contents of which are expressly incorporated herein by reference.

BACKGROUND OF THE INVENTION

The present invention relates to the field of plasma processing of silicon wafers and more particularly to plasma processing equipment having automated electrode handling capabilities.

As is known in the art, a fundamental step in the manufacturing of semiconductor devices, such as integrated circuits (ICs), is the process of forming electrical interconnections. The formation of electrical circuits containing components such as semiconductor transistors, involves a series of steps starting with the formation of a blank silicon wafer. The blank silicon wafer or substrate is then processed using successive steps of depositing to and etching away various materials to form the proper interconnections and therefore the electrical circuits.

Such depositing and etching operations may be performed in a plasma reactor system. In semiconductor manufacturing, plasma reactor systems are used to remove or deposit material to or from a workpiece (e.g., semiconductor substrate) in the process of making integrated circuit (IC) devices. A key factor in obtaining the highest yield and overall quality of ICs is the uniformity of the etching and deposition processes.

When it is desired to deposit materials onto the wafer, a plasma reactor system may be used to sputter a variety of materials, one of which could be silicon, onto semiconductor wafers. In these sputtering applications, a silicon disk, or silicon dioxide disk or doped-silicon disk is used as a facing on the metal drive electrode to provide a source of material to be deposited on the semiconductor wafers to form variety of circuit patterns. This silicon disk is herein referred to as the source electrode or target.

There are several different kinds of plasma processes used during wafer processing. These processes include (1) plasma etching, (2) plasma deposition, (3) plasma assisted photo resist stripping and (4) in situ plasma chamber cleaning. One artifact of these plasma processes is the erosion of the source electrode as it is consumed during the formation of plasma, hence, a purpose for the source electrode is to serve as a protective barrier between the driven RF electrode and the plasma. Furthermore, each of these plasma processes has associated plasma density non-uniformities, for example, due to the generation of harmonics of the plasma excitation frequency. These non-uniform plasmas erode the plasma system silicon source electrode non-uniformly. The non-uniformly etched silicon electrode in turn exacerbates the non-uniformity of the plasma. To ensure uniform plasmas, these silicon electrodes are changed frequently. Otherwise, if a system with a non-uniform plasma is used for semiconductor wafer processing, the non-uniform plasma discharge can produce non-uniform etching or deposition on the surface of the semiconductor wafers. Thus, the control of the uniform etching or erosion of the silicon electrode directly affects the quality of integrated semiconductor chips manufactured by the semiconductor industry.

As illustrated in FIG. 1, a typical prior art plasma reactor system 10 includes, a plasma chamber 11 in which a wafer 18 is processed. Wafer 18 is placed on a chuck 16 and exposed to various plasmas depending on whether the wafer is undergoing an etch or deposition step. The plasma formed in plasma chamber 11 also varies depending on the material being deposited or etched on wafer 18. The plasma within chamber 11 is formed by electro-mechanically coupling a source electrode 14 to the metal drive electrode 12 and driving a RF signal through the metal electrode 12 and consequently through source electrode 14. Source electrode 14, in effect, becomes the electrode in direct physical and electrical contact with plasma. The plasma formed within chamber 11 depends on a variety of factors including the RF power magnitude, the RF drive frequency, the chamber gas pressure and the composition of gases residing in the chamber. As described above, during processing of silicon wafers, a silicon electrode may be used as the source electrode.

As also described above, during silicon wafer processing, the silicon electrode is consumed and thus must be changed periodically in order to maintain consistent processing conditions within the plasma chamber. In prior art systems such as that shown in FIG. 1, the silicon source electrode 14 is attached to the metal electrode 12 by means of metal screws 23 which pass through clearance holes in the silicon electrode and mate with threaded holes in the metal electrode or metal nuts 25 on the back side of metal drive electrode 12. The clearance holes in the silicon electrode are countersunk to assure that the heads of the attachment screws do not protrude beyond the surface of the silicon electrode.

Due to the electrical, thermal and physical contact requirements between the silicon disk and the drive electrode, there is a need to insure proper electrical and mechanical connection between the silicon electrode 14 and the metal electrode 12. Even when an initial proper contact is established between metal drive electrode 12 and silicon source electrode 14, as plasma processing proceeds and the silicon drive electrode is consumed, the plasma changes. However, systems currently available, such as plasma system 10 shown in FIG. 1, provide no means of adjusting the source electrode/metal drive electrode contact during processing. There is therefore a need to provide a way to adjust the contact of the silicon disk to the electrode in real time during a wafer processing step and/or between wafer processing steps in order to fine-tune plasma uniformity.

Furthermore, since the silicon source electrode described above is consumed during use, it must be changed on a relatively frequent basis. Even when the silicon source electrode is not consumed, it may be desirable to change a source electrode to one made of a different material or one having a different shape to produce a different plasma in plasma chamber 11. Unfortunately, in prior art plasma processing systems, changing the source electrode 14 requires shutting down the plasma process, venting the chamber, opening the chamber, removing the attachment screws, replacing the consumed silicon electrode manually with a new one and putting everything back together again. This process is time consuming, reduces wafer throughput, and may create added defects through contamination.

It would be advantageous therefore to provide a plasma processing system where the source electrode could be replaced automatically without opening the plasma chamber. It would be further advantageous to provide an apparatus for plasma processing of semiconductor wafers which allows for secure, repeatable attachment of a source electrode to the metal drive electrode where the contact between the source electrode and metal drive electrode is dynamically adjustable during operation of the plasma processing system.

BRIEF SUMMARY OF THE INVENTION

According to one aspect of the present invention, a plasma processing system is provided that includes an automated electrode retention mechanism as well as an automated electrode handling system. The retention mechanism includes an elevator system that raises and lowers a source electrode in order to dynamically couple and decouple the source electrode from the drive electrode. In one embodiment the automated retention mechanism includes a plurality of lift arms coupled to associated drive units. Activating the drive units causes the lift arms to move in a vertical direction within the plasma processing system vacuum chamber. Coupled to the lower end of the lift arms is an electrode shelf that supports the source electrode while it is being raised and lowered as well as retaining the source electrode to the drive electrode. The shelf is generally ring-shaped and supports the source electrode about the perimeter of its lower face. That is, the interior diameter of the shelf is slightly less than the diameter of the source electrode. In the preferred embodiment, the shelf is made of quartz.

According to another aspect of the present invention, in addition to providing the ability to raise and lower the source electrode, the retention mechanism also functions to provide dynamic control of the contact force between the source electrode and the drive electrode. With such an arrangement, a change in the contact forces can be made to eliminate plasma nonuniformities associated with a slowly eroding electrode.

According to yet another aspect of the present invention, an automated electrode handling system is provided that allows a source electrode to be changed in a plasma processing system without the need to dismantle the system. The automated electrode handling system includes a robotic arm that is capable of retrieving a used source electrode from the automated electrode retention mechanism and placing it in a discard station within the system. Additionally, the automated electrode handling system is capable of retrieving a new source electrode from a staging area within the plasma processing system and placing it on the automated electrode retention mechanism such that it can be brought into contact with the drive electrode. Preferably, the automated electrode handling system is configured to work in conjunction with a load-lock system in order to isolate the working mechanisms of an automated electrode handling system from the plasma processing vacuum chamber during processing of wafers. With such an arrangement, a source electrode can be replaced in a plasma processing system without having to fully shut down the system or dismantle the system. As such workflow throughput in a plasma processing system so equipped dramatically increases.

BRIEF DESCRIPTION OF THE SEVERAL VIEWS OF THE DRAWING

The above described and other features of the present invention will be described while referring to the accompanying drawings in which.

DETAILED DESCRIPTION OF THE INVENTION

Figure 1:
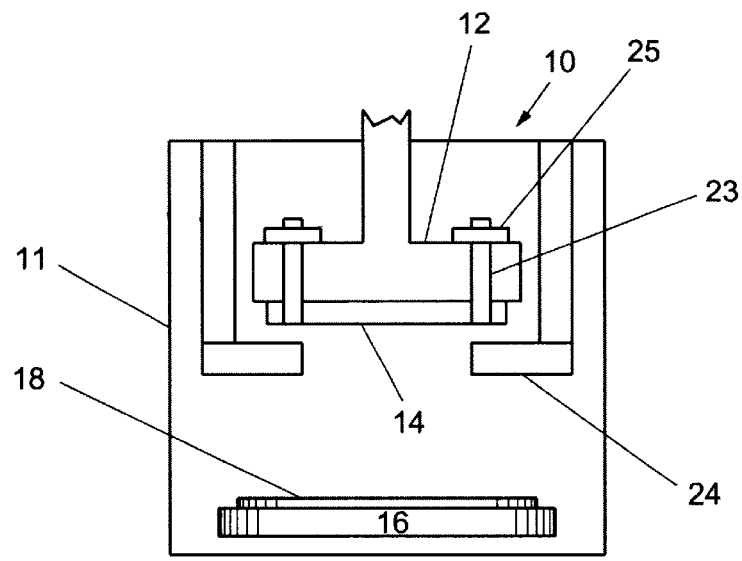
FIG. 1 is a diagrammatic elevational representation of a prior art plasma deposition and etching system.
Figure 2:
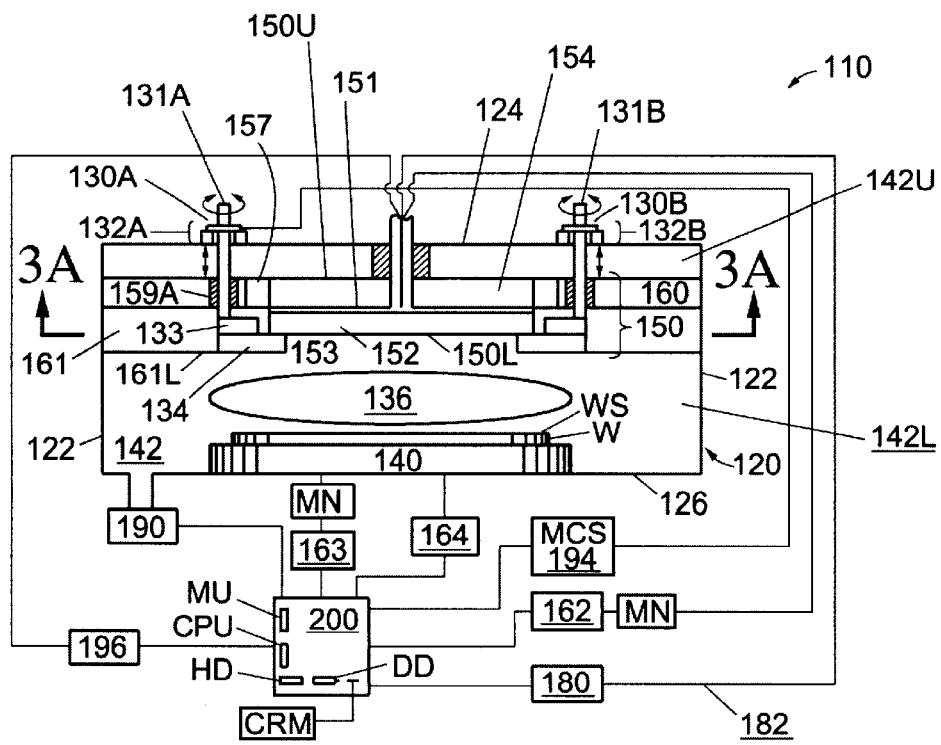
FIG. 2 is schematic elevational diagram of a preferred embodiment of a plasma deposition and etching system according to the present invention showing an automated electrode clamping assembly.

Referring now to FIG. 2, a plasma deposition and etching system, or plasma processing system 110 is shown to include, inter alia, a plasma chamber 120, which is a vacuum processing chamber adapted to perform plasma deposition and/or etching of a workpiece W. Workpiece W has an upper surface WS that is acted upon by plasma 136 formed in chamber 120. Chamber 120 has sidewalls 122, an upper wall 124 and a lower wall 126 that enclose an interior region 142 capable of supporting a plasma 136 generated in region 142. Chamber 120 further includes, within region 142, a workpiece support 140 arranged adjacent to lower wall 126 for supporting workpiece W while the workpiece is being processed in chamber 120. Workpiece support 140 may be an integral portion of an automated wafer handling system or material control system 194. As will be described in more detail below, material control system 194 operates to control electrode retention mechanism 130 in addition to controlling wafer loading and unloading. Workpiece W may be, for example, a semiconductor substrate, such as silicon, on which patterns have been formed, where the patterns correspond to product devices (e.g. electronic circuits). Workpiece W may also be a bare semiconductor substrate that requires plasma cleaning, metal deposition, or metal or insulator etching, photoresist ashing, etc. As will be appreciated by those of skill in the art, and automated wafer handling system that is a component of material handling system 194 may be used to move unprocessed wafers into chamber 120 and processed wafers out of chamber 120.

Chamber 120 of system 110 further includes an electrode assembly 150 arranged within interior region 142 adjacent workpiece support 140. Electrode assembly 150 is preferably capacitively coupled to workpiece W when the workpiece is being plasma processed. Electrode assembly 150 has an upper surface 150U facing away from workpiece support 140 and a lower surface 150L facing towards workpiece support 140. Electrode assembly 150 serves to further divide plasma chamber interior region 142 into an upper region 142U between upper chamber wall 124 and upper electrode surface 150U, and a lower region 142L between lower electrode surface 150L and lower chamber wall 126. Preferably, regions 142U and 142L are totally isolated from one another by assembly 150. Plasma 136 is formed in the evacuated region defined as the lower region 142L of interior region 142. Plasma 136 ideally has a plasma density (i.e., number of ions/volume, along with energy/ion) that is preferably uniform in the portion of 142L above workpiece W, unless the density needs to be tailored to account for other sources of process non-uniformities. Plasma 136 has a density profile referred to herein as a "plasma density profile."

As will be described in more detail below, electrode assembly 150 further includes a metal drive electrode 154 that has a source electrode 152 coupled thereto. Source electrode 152 can include a layer 151 that is made up primarily of metal for providing an electro-mechanical interface between source electrode base material 153 and metal drive electrode 154. Alternatively, layer 151 can be an oxide layer that isolates source electrode base material 153 from electrically contacting metal drive electrode 153. With this alternate arrangement, base material 153 is capacitively coupled to metal drive electrode 154 when power (i.e., electrical energy) is applied to the metal drive electrode. Furthermore, source electrode 152 can be made of a homogeneous material wherein portions 151 and 153 are the same material. Source electrode 152 is electrically insulated from chamber wall 160, which serves as the partition wall between upper region 142U and lower region 142L, by insulator ring 157, preferably fabricated from alumina. A wall plate 161 is attached to wall 160 and surrounds electrode assembly 150 such that lower surface 161L of plate faces plasma 136. Wall plate 161 is preferably constructed of silicon or quartz to be compatible with the silicon processing environment.

Electrode assembly 150 can be electrically connected to an RF power supply system 162. RF power supply 162 can have coupled thereto an associated match network MN to match the impedance of electrode assembly 150 and the associated excited plasma 136 to the source impedance of RF power supply system 162, thereby increasing the maximum power that may be delivered by the RF power supply 162 to the plasma electrode assembly 150 and the associated excited plasma 136. The plasma density of plasma 136 increases as the power delivered by RF power supply 162 to plasma 136 increases. Hence, for a given RF power supply system, the maximum attainable plasma density of plasma 136 is increased by means of the matching network.

Also referring to FIG. 2, the chuck 140 can be coupled to an RF energy source (generator) 163 to provide chuck 140 with a RF bias. RF generator 163 can be coupled to chuck 140 through a corresponding match network MN. RF bias is well-known to those skilled in the art and can be employed for ion energy control at the wafer surface WS. Moreover, a vertical translation system 164 can be utilized to vary the relative position of the wafer W in the processing chamber 120. Using the translation system 164, the wafer W can be placed in close proximity to the upper electrode 150 while being capable of lowering the wafer W for transfer to and from the chamber.

Still referring to FIG. 2, plasma processing system 110 further includes a gas supply system 180 in pneumatic communication with plasma chamber 120 via one or more gas conduits 182, for supplying gas in a regulated manner to form plasma 136. Gas supply system 180 supplies such gases as chlorine, hydrogen-bromide, octafluorocyclobutane, and various other fluorocarbon compounds, and for chemical vapor deposition applications, supplies silane, ammonia, tungsten-tetrachloride, titanium-tetrachloride, and the like.

Plasma processing system 110 also includes a vacuum system 190 pneumatically connected to chamber 120 for evacuating interior region section 142L to a pressure that depends on the nature of plasma 136.

As mentioned above, plasma processing system 110 can further include a workpiece handling and robotic system as part of material handling system 194 in operative communication with chamber 120 for transporting workpieces W to and from workpiece support 140. In addition, a cooling system 196 in fluid communication with electrode assembly 150 is preferably included for flowing a cooling fluid to and from the electrode 150.

Plasma processing system 110 can also include a main control system 200 to which RF power supply system 162, energy source 163, vertical translation system 164, gas supply system 180, vacuum pump system 190, material control system 194 and cooling system 196 are electronically connected. In the preferred embodiment, main control system 200 is a computer having a memory unit MU having both random-access memory (RAM) and read-only memory (ROM), a central processing unit CPU (e.g., PENTIUM™® processor from Intel Corporation), and a hard disk HD, all electronically connected. Hard disk HD serves as a secondary computer-readable storage medium, and may be for example, a hard disk drive for storing information corresponding to instructions for controlling plasma system 110. Control system 200 also preferably includes a disk drive DD, electronically connected to hard disk HD, memory unit MU and central processing unit CPU, wherein the disk drive is capable of accepting, reading and writing to a computer-readable medium (CRM), such as a floppy disk or compact disk (CD), on which is stored information corresponding to instructions for control system 200 to control the operation of plasma system 110.

It is also preferable for main control system 200 to have data acquisition and control capability. A preferred control system 200 is a computer, such as a DELL PRECISION WORKSTATION 610™, available from Dell Corporation, Dallas, Tex. As will be appreciated by those of skill in the art, data acquisition and control may be facilitated by coupling the electronic control systems associated with each of the subsystems 162, 163, 164, 180, 190, 194, and 196 mentioned above via the workstation's included serial, parallel or universal serial bus (USB) ports or can require additional hardware (not shown) coupled to main control system 200. All of the systems as described thus far can, unless indicated otherwise below, be constituted by systems known in the art or constructed according to principles known in the art.

Automated Electrode Replacement System

According to the present invention, an automated electrode replacement system is provided for use in a plasma processing system. This system provides the ability to dynamically change a source electrode within a plasma processing chamber without the prior art requirement of shutting down and dismantling the chamber in order to do so.

Figure 4A:
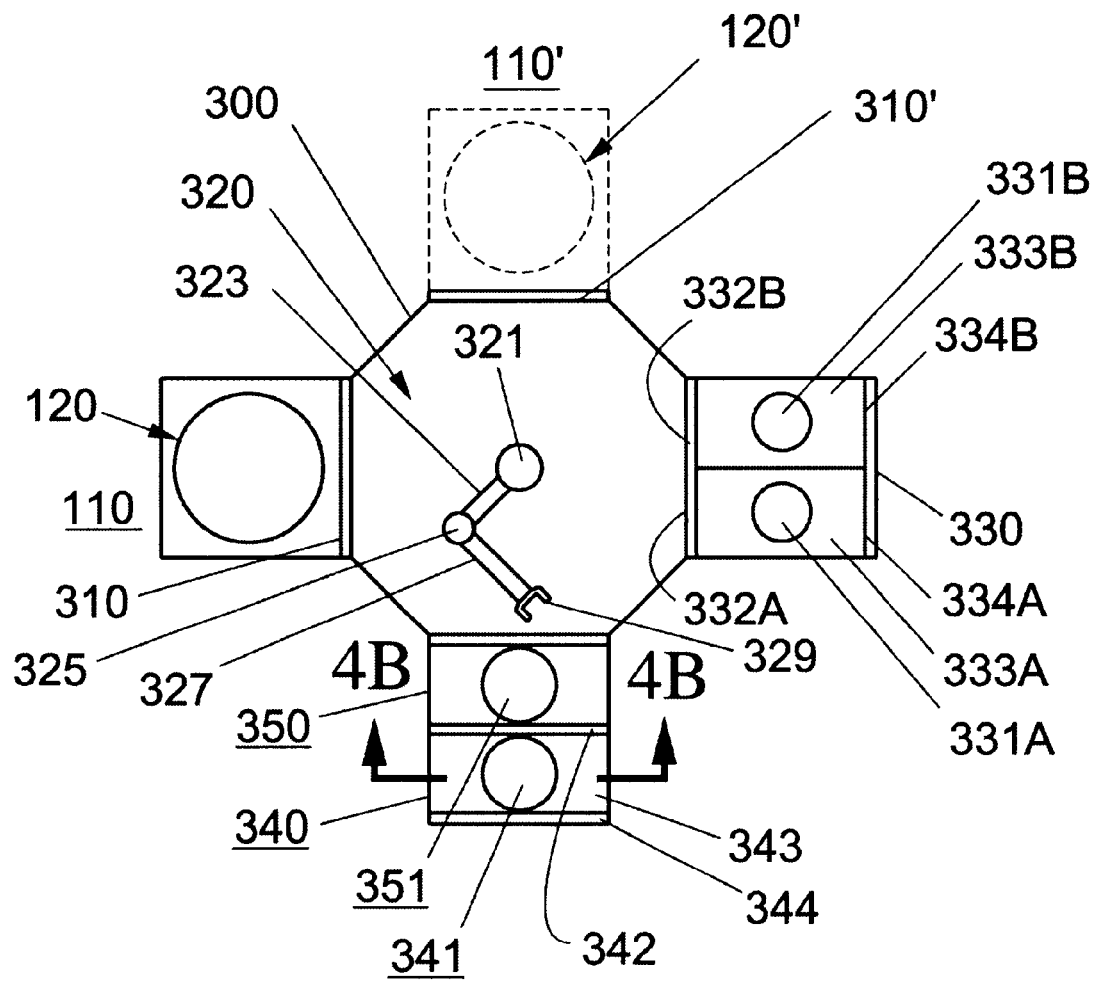
FIG. 4A is a schematic plan diagram of a preferred embodiment of a plasma deposition and/or etching system according to the present invention used with a wafer/electrode handling system.

Still referring to FIG. 2, a preferred embodiment of an automated electrode handling system forming a component of an automated electrode replacement system is shown to include electrode elevator assemblies, two of which, 130a and 130b, are shown in FIG. 2, in combination with a wafer/electrode handling system 320 shown in FIG. 4A. Although only two electrode elevator assemblies are shown, in practice three or more such mechanisms are typically employed. Combined electrode elevator assemblies (including assemblies 130a and 130b as well as other assemblies) will herein be referred to generically as the electrode retention mechanism. It should be understood that any description given with respect to one elevator assembly (e.g. assembly 130a) is applicable to the remaining elevator assemblies.

According to one aspect of the present invention, the electrode retention mechanism is operable to allow source electrode 152 to be raised and lowered such that it is in contact with or isolated from metal drive electrode 154. In FIG. 2, the electrode retention mechanism is shown in the loaded or plasma system operating position in which electrodes 152 and 154 are in contact with one another. According to another aspect of the present invention, and as will be discussed in more detail below, the electrode retention mechanism is also operable to dynamically adjust the contact between source electrode 152 and metal drive electrode 154. Moreover, the electrode retention mechanism may be adjusted to lower the source electrode 152 for replacement.

In particular and according to a preferred embodiment of the present invention, electrode elevator assembly 130a includes, inter alia, a lift arm 131a and a drive unit 132A. Lift arm 131a is moveably coupled to, and passes through, drive unit 132A. Lift arm 131a further passes from outside of plasma chamber 120 into plasma chamber interior region 142. Lift arm 131A is preferably of a length such that source electrode 152 may be lowered to a position in interior region 142 that provides access by electrode handling system 320 (described below). Lift arm 131A is movable along substantially its entire length in the directions indicated by arrows adjacent lift arm 131A in FIG. 2. As will be appreciated by those of skill in the art, lift arm 131A passes through the upper wall of chamber 120 by way of a vacuum feed-through (not shown) and through partition wall 160 by way of vacuum feed-through 159A as shown in FIG. 2. This type of arrangement allows vacuum chamber 120 to be evacuated and to maintain a vacuum as described above. One such vacuum feed-through can be a Ferrofluidic® bearing.

In order to support source electrode 152, lift arm 131A is further coupled, as by fusing, to a quartz spacer ring 133 that is further fused to a quartz ring clamp 134. Lift arm 131A, as well as lift arms 131B and 131C shown in FIG. 3A, can be threaded or fixed to spacer ring 133 in any number of ways known to those of skill in the art. The quartz ring clamp is generally a ring-shaped section of quartz having an inner diameter slightly less than the diameter of source electrode 152. As seen in FIG. 2, this arrangement provides a lip or shelf on which source electrode 152 rests. As quartz ring clamp 134 is raised or lowered a concomitant raising and lowering of source electrode 152 positioned therein occurs.

Each lift arm 131A, 131B and 131C is actuated by a respective drive unit, two of which, 132A, 132B, are shown in FIG. 2. Each drive unit 132A, 132B, etc., may be a rotary stepper motor that engages a respective lift arm 131A, 131B, 131C via a tooth and gear arrangement, a lead screw type arrangement or some other well-known method of driving a linear device with a rotary motor. Alternately, each drive unit 132A, 132B, etc., may be a linear stepper motor where the respective lift arm 131A, 131B, 131C forms the "armature" of the linear motor (i.e., is fitted with magnets, etc.). As mentioned above, each drive unit is controlled by material control system 194, which is electronically coupled to each drive unit 132A, 132Bb, etc., and receives instructions from main control system 200.

Referring now to FIG. 4A plasma processing system 110 with chamber 120 interfaces with a transfer chamber 300 through a gate 310. Moreover, a second plasma processing system 110' with chamber 120' may also interface with transfer chamber 300 through gate 310'. Gates 310 and 310' isolate the plasma processing environment from the transfer chamber environment during processing. However, between processing operations and after chamber purging, either gate may be opened to the transfer chamber environment for exchange of wafer W (FIG. 2) and/or source electrode 152 (FIG. 2)). The transfer chamber 300 encloses a "clean" (evacuated region) environment for the transfer of wafers and/or source electrodes to and from either one of processing chambers 120 and 120'. Transfer chamber 300 further includes a wafer/electrode handling mechanism 320 that includes a robotic arm with a first rotatable section 321, a first translational arm 323, a second rotatable section 325, a second translatable arm 327 and a wafer/electrode support blade 329. The first rotatable section 321 is also capable of vertical movement to enable wafer/electrode pick-up.

Transfer chamber 300 also interfaces with a wafer cassette system 330, which contains wafer cassettes 331A and 331B, via gates 332A and 332B. In general, the wafer/electrode handling mechanism 320 can access a first wafer cassette (i.e. 331a) for transfer of wafers to and from processing chamber 120 while gate 332A remains open. During this time, the region within wafer cassette 331A is evacuated to the same pressure as the transfer chamber 300. Gate 334A isolates cassette 331A from atmospheric conditions. When wafer 331A is being transferred, gate 332B may be closed while cassette 331B is vented to atmosphere and accessed by operator through gate 334B. Wafer handling systems as described above are well-known to those of ordinary skill in the art.

Figure 4B:
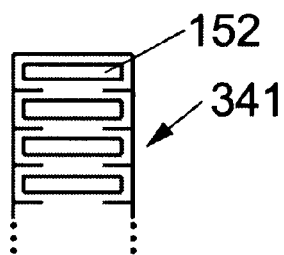
FIG. 4B is a schematic elevational view of an electrode cassette shown in FIG. 4A.

Transfer chamber 300 may also interface with a source electrode cassette system 340 comprising an electrode cassette 341 that contains a number of electrodes for replacement as shown in cross-section in FIG. 4B. Each source electrode 152 may be of the same design or of different design for testing, etc. As with the wafer cassette system 330, a first gate 342 may be opened to the transfer chamber 300 when the region 343 is evacuated and purged with inert gas. It may remain open while source electrodes 152 are exchanged in the process chambers 120 and 120'. Furthermore, a second gate 344 may be used to isolate the evacuated region 343 from atmospheric conditions. Similarly, gate 341 may be closed, region 343 may be vented to atmospheric conditions, and gate 344 opened, so that an operator can access the source electrode cassette 341. Transfer between the electrode cassette and the process chamber 120 may be facilitated using the same handling system (i.e. 320) as is used for the wafer handling.

Moreover, transfer chamber 300 may access electrode cassette system 340 through a region 350 used to house an alignment device 351. The alignment device 351 is normally employed to azimuthally align wafers in such a way that the wafer flat is always located in the same position before placing a wafer in process chamber 120 or 120'. This procedure as well as the loading and unloading of a wafer between cassette 331A and process chamber 120 are well-known to those of ordinary skill in the art. The alignment device 351 can also be used to align the source electrode 152 so that the gas distribution orifices through each source electrode 152 are positioned in the same location for automatic alignment with gas orifices in the metal drive electrode 154.

Referring back to FIG. 2, the source electrode 152 and the electrode retention mechanism 130 are shown to be in the "loaded" position. In order to unload a used electrode and replace it with a new electrode, the electrode retention mechanism 130 must be placed in the "unload" position. In order for electrode retention mechanism 130 to be placed in the unload position, main control system 200 sends instructions to material control system 194. In the following description, reference is made to electrode elevator assemblies 130A and 130B and lift arms 131A, 131B because only those components are illustrated in FIG. 2. It should be understood, however, that the illustrated embodiment in fact has a third lift arm 131C, shown in FIGS. 3A and 3B, and, correspondingly, a third electrode elevator assembly which includes a third drive unit. Material control system 194 converts those commands into the proper electrical signals required to operate electrode elevator assemblies 130$a$ and 130$b$. Electrode elevator assemblies 130A, 130B operate substantially simultaneously to cause lift arms 131A, 131B to deploy into or out of chamber area 142. As will be appreciated by those of skill in the art, electrode elevator assemblies 130A, 130B along with lift arms 131A, 131B may be configured with limit sensors (not shown) to determine when lift arms 131A, 131B, and therefore quartz ring 134, are deployed fully into chamber 120 or fully retracted towards metal drive electrode 154. Alternately, electrode elevator assemblies 130A, 130B may be equipped with encoders that provide positional feedback to material control system 194. With this arrangement, electrode elevator assemblies 130A, 130B may be instructed (by main control unit 200) to deploy or retract lift arms 131A, 131B precise distances along their travel length.

In addition to providing loading and unloading capabilities of source electrode 152, electrode retention mechanism 130 also serves as a way to dynamically adjust the contact between source electrode 152 and metal drive electrode 154 during operation of plasma processing system 110. As described previously, providing this adjustment mechanism allows an operator to compensate for plasma non-uniformities created by an eroding source electrode. This adjustment can be accomplished by sending commands from main control system 200 that cause material control system 194 to activate electrode elevator assemblies 130A and 130B to further draw lift the arms 131A, 131B in the upward direction. Clearly, driving lift arms 131A, 131B in a further upward direction after contact has already been established between source electrode 152 and metal drive electrode 154 increases the bearing force of quartz ring clamp 134 against the outer perimeter of source electrode 152. As a consequence, the contact force between source electrode 152 and metal drive electrode 154 increases. Of course, the same procedure can be employed to reduce the contact force between source electrode 152 and metal drive electrode 154 by activating electrode elevator assemblies 130A, 130B to slightly deploy lift arms 131A, 131B into chamber space 142. A feedback mechanism can be employed (for example electronic strain gauge) to determine the magnitude of force to be applied to lift arms 131A, 131B via drive units 132A, 132B. This feedback mechanism can then be used to control the amount of drive applied by drive units 132A, 132B. Alternately, manual adjustment means can be provided to supply forces additional to those applied by drive units 132A, 132B.

Figure 3A:
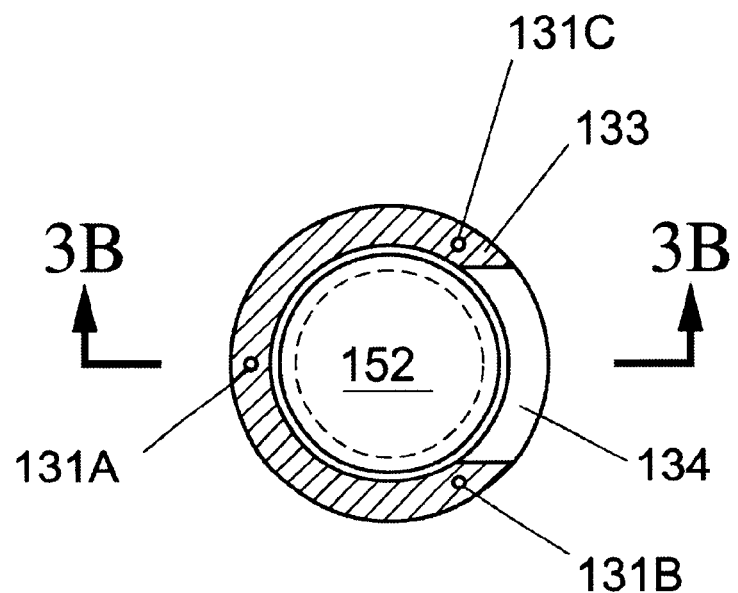
FIG. 3A is a sectional plan view of the plasma deposition and etching system of FIG. 2 taken along a line 3A—3A.
Figure 3B:
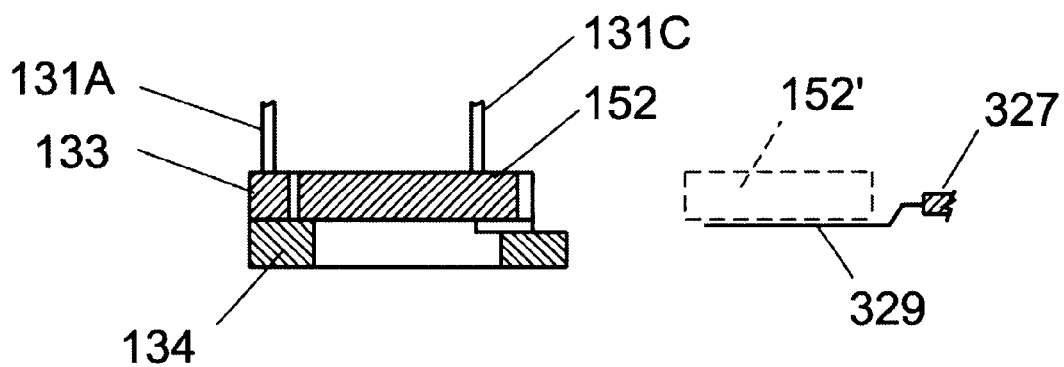
FIG. 3B is a cross-sectional view of the clamp assembly of FIG. 3A taken along line 3B—3B.

Referring now to FIG. 3A, which is a top sectional view of plasma processing system 110 taken along the line 3A—3A of FIG. 2, the general relationship between fused rods 131A, 131B, 131C, source electrode 152 and spacer ring 133 is shown. As shown, the distance between any two of fused rods 131A, 131B and 131C is such that source electrode 152 can pass therebetween unobstructed. FIG. 3B, which is a cross-sectional view of the source electrode 152 and clamping system in FIG. 3A along the line 3B—3B, illustrates a means by which a used source electrode 152 is removed and a new source electrode 152' is inserted.

The operation of wafer/electrode handling system 320 (FIG. 4A) and automated electrode retention mechanism 130 (FIG. 2) in concert to effect an electrode change will now be described while referring to FIG. 2 and FIG. 4A. As described above, source electrode 152 is shown in the operative position. That is, it is positioned to be in physical contact with metal drive electrode 154. Source electrode 152 is secured to metal drive electrode 154 as a result of the forces applied by lift arms 131A and 131B to quartz ring clamp 134 which bears against a perimeter radius of source electrode 152. At some point during processing of silicon wafers, source electrode 152 will have eroded to a point where the plasma non-uniformities created cannot be eliminated by adjusting the contact between silicon source electrode 152 and metal drive electrode 151. Moreover, the source electrode 152 can erode to the point of jeopardizing the structural integrity of the permanent structure beneath (i.e. the metal drive electrode 154). Additionally, during wafer processing, it can be desired to change to a source electrode of a different material. As a result, a system operator can replace source electrode 152 with a second source electrode 152' of a different material.

In a conventional capacitive discharge plasma processing system where the electrode-to-wafer spacing may be as close as an inch, the chuck 140 must be displaced downward via translation device 164 to a suitable position for wafer removal. During this time, the process chamber is purged with inert gas and the pressure is adjusted to that of the transfer chamber 300. After removal of the wafer W, the chuck 140 may be further displaced downward to enable more space for source electrode 152 replacement. In order to accomplish the removal of source electrode 152 and replacement with source electrode 152', source electrode 152 must first be lowered from its position in contact with metal drive electrode 154. To accomplish this contact separation, the electrode retention mechanism must first be activated to lower source electrode 152. Source electrode 152 must be lowered to a location where it is accessible to wafer/electrode handling mechanism 320 (i.e. the "unload" position). This access position is partially depicted in FIG. 3B. Once source electrode 152 has been placed in the unload position by electrode retention mechanism 130, wafer/electrode handling mechanism 320 moves through gate 310 into the processing chamber 120 where it slides blade 329 under the source electrode 152 (without contact), moves upward to make contact with the source electrode 152 and lifts it from the ring clamp 134. Electrode handling mechanism 320 then moves outward from the process chamber 120 through gate 310 while carrying the source electrode 152. The wafer/electrode handling system 320 then places the used source electrode 152 into the electrode cassette 341 and picks up the next electrode in the cassette stack (or the next programmed selection). As before, the wafer/electrode handling system 320 returns to the vertical position for inserting the new source electrode 152' through gate 310 into process chamber 120 and into electrode retention mechanism 130. Once there, it moves vertically downward until the new source electrode 152' makes contact with ring clamp 134 and blade 329 of wafer/electrode handling system 320 moves out of contact with the source electrode. Blade 329 and wafer/electrode handling system 320 are then removed from the process chamber 120 and gate 310 is closed. Once the new source electrode 152' is loaded onto the ring clamp 134, the electrode retention system 130 can facilitate clamping the source electrode 152' to the metal drive electrode 154 as described above. At this time, chuck 140 can be moved to its designated position for receiving the next wafer to be processed.

As will be appreciated by those of skill in the art, the entire process of exchanging a source electrode can be accomplished via a computer program executed by main control system 200. Such a program would have all movements of electrode retention mechanism 130 and wafer/electrode handling system 320 as well as operation of gates 334, 310 and 342 programmed in the proper sequence to accomplish the exchange. Alternately, an operator can be given real-time control over all motion elements via a keyboard, joystick or other user interface device (not shown) attached to main control system 200.

Although the above described electrode assembly has been described in connection with a plasma reactor, it should be understood that the present invention might be employed in any semiconductor processing system where a drive electrode is coupled to a source electrode and where it is desirable to dynamically change the source electrode without dismantling the system. The many features and advantages of the present invention are apparent from the detailed specification and thus, it is intended by the appended claims to cover all such features and advantages of the described apparatus which follow the true spirit and scope of the invention. Furthermore, since numerous modifications and changes will readily occur to those of skill in the art, it is not desired to limit the invention to the exact construction and operation described herein. Moreover, the process and apparatus of the present invention, like related apparatus and processes used in the semiconductor arts tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. An automated electrode replacement system comprising:
   an automated electrode retention mechanism for use within a vacuum chamber of a plasma processing system, said electrode retention mechanism being operable under program control to couple and decouple a source electrode with respect to a drive electrode; and
   an automated electrode handling system operatively associated with the vacuum chamber, said electrode handling system being operable under program control to remove the source electrode from said electrode retention mechanism, said electrode handling system being further operable under program control to retrieve a second source electrode from a staging area and place the second source electrode within said electrode retention mechanism.

2. The automated electrode replacement system of claim 1 wherein said electrode retention mechanism comprises:
   a ring clamp;
   a plurality of lift arms coupled to said ring clamp; and
   a plurality of drive units corresponding to and coupled to said plurality of lift arms.

3. The automated electrode replacement system of claim 1 further comprising a programmed computer coupled to said automated electrode retention mechanism and said automated electrode handling system and operable to execute a program to cause said automated electrode retention mechanism and said automated electrode handling system to operate without user intervention to cause the source electrode to be replaced by the second source electrode.

4. The automated electrode replacement system of claim 1 wherein said automated electrode handling system comprises a robotic lift arm outside the vacuum chamber.

5. The automated electrode replacement system of claim 1 wherein said electrode retention mechanism is operable to dynamically adjust a contact force between said source electrode and said drive electrode.

6. The automated electrode replacement system of claim 1 wherein said source electrode has deposited thereon, a layer of metal on a first face of the source electrode and wherein the metal layer is a contact surface between the source electrode and the drive electrode.

7. The automated electrode replacement system of claim 1 wherein said automated electrode handling system comprises a transfer chamber in which said electrode handling system resides while the vacuum chamber is used for plasma processing of semiconductor wafers.

8. A plasma processing system comprising:
   a vacuum chamber capable of supporting a plasma generated therein;
   a workpiece support station;
   an electrode assembly including a source electrode and a drive electrode;
   a source electrode staging area containing a second source electrode;
   an automated electrode retention mechanism within said vacuum chamber, said electrode retention mechanism being operable under program control to couple and decouple said source electrode to and from said drive electrode; and
   an automated electrode handling system operatively associated with said vacuum chamber, said electrode handling system being operable under program control to remove said source electrode from said electrode retention mechanism, said electrode handling system further being operable under program control to retrieve a second source electrode from said staging area and place said second source electrode within said electrode retention mechanism.

9. The plasma processing system of claim 8 wherein said electrode retention mechanism further comprises:
   a ring clamp;
   a plurality of lift arms coupled to said ring clamp; and
   a plurality of drive units corresponding to and coupled to said plurality of lift arms.

10. The plasma processing system of claim 8 further comprising a programmed computer coupled to said automated electrode retention mechanism and said automated electrode handling system and operable to execute a program to cause said automated electrode retention mechanism and said automated electrode handling system to operate without user intervention to cause said source electrode to be replaced by said second source electrode.

11. The plasma processing system of claim 8 wherein said automated electrode handling system further comprises a robotic lift arm outside said vacuum chamber.

12. The plasma processing system of claim 8 wherein said electrode retention mechanism is operable to dynamically adjust a contact force between said source electrode and said drive electrode.

13. The plasma processing system of claim 12 wherein said source electrode has deposited thereon a layer of metal or dielectric material on a first face of said source electrode and wherein said layer is a contact surface between said source electrode and said drive electrode.

14. The plasma processing system of claim 8 wherein said automated electrode handling system comprises a transfer chamber in which said electrode handling system resides while said vacuum chamber is used for plasma processing of semiconductor wafers.

15. The plasma processing system of claim 14 wherein said automated electrode handling system further comprises a wafer handling system.

* * * * *